US009577597B2

(12) United States Patent
Yosui et al.

(10) Patent No.: US 9,577,597 B2
(45) Date of Patent: Feb. 21, 2017

(54) LC COMPOSITE COMPONENT

(71) Applicant: Murata Manufacturing Co., Ltd., Kyoto (JP)

(72) Inventors: Kuniaki Yosui, Kyoto (JP); Takahiro Baba, Kyoto (JP); Wataru Tamura, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/795,165

(22) Filed: Jul. 9, 2015

(65) Prior Publication Data

US 2015/0310994 A1  Oct. 29, 2015

Related U.S. Application Data

(63) Continuation of application No. PCT/JP2013/082928, filed on Dec. 9, 2013.

(30) Foreign Application Priority Data

Jan. 22, 2013  (JP) .................................. 2013-009029
Feb. 26, 2013  (JP) .................................. 2013-035721
Jun. 6, 2013   (JP) .................................. 2013-120273

(51) Int. Cl.
*H03H 7/01* (2006.01)
*H01G 4/33* (2006.01)
(Continued)

(52) U.S. Cl.
CPC ........ *H03H 7/0115* (2013.01); *H01F 17/0013* (2013.01); *H01F 27/40* (2013.01);
(Continued)

(58) Field of Classification Search
CPC .................... H03H 7/0115; H03H 2001/0085; H03H 7/175; H01G 4/40; H01G 4/33
(Continued)

(56) References Cited

U.S. PATENT DOCUMENTS

2006/0220972 A1  10/2006  Saitoh
2007/0188265 A1*  8/2007  Perreault ................ H03H 7/427
                                                      333/181

(Continued)

FOREIGN PATENT DOCUMENTS

JP   S53-113016 U   9/1978
JP   S62-127118 U   8/1987
(Continued)

OTHER PUBLICATIONS

International Search Report issued in Application No. PCT/JP2013/082928 dated Mar. 11, 2014.
(Continued)

*Primary Examiner* — Stephen E Jones
*Assistant Examiner* — Rakesh Patel
(74) *Attorney, Agent, or Firm* — Pearne & Gordon LLP

(57) ABSTRACT

Provided is an LC composite component having a multi-layer substrate, a pattern coil, and a chip capacitive element. The multi-layer substrate is configured such that insulating layers are stacked. The pattern coil forms a coiled shape of which the coil axis extends along a stacking direction of the multi-layer substrate, and includes a coil conductor disposed between the insulating layers. The chip capacitive element includes a ceramic body having a relative permittivity higher than that of the insulating layers and counter electrodes. The chip capacitive element is at least partially disposed within the pattern coil.

17 Claims, 14 Drawing Sheets

(51) Int. Cl.
*H01F 17/00* (2006.01)
*H01F 27/40* (2006.01)
*H01G 4/01* (2006.01)
*H01G 4/06* (2006.01)
*H01G 4/224* (2006.01)
*H01G 4/40* (2006.01)
*H03H 1/00* (2006.01)

(52) U.S. Cl.
CPC ............. *H01G 4/01* (2013.01); *H01G 4/06* (2013.01); *H01G 4/224* (2013.01); *H01G 4/33* (2013.01); *H01G 4/40* (2013.01); *H03H 7/175* (2013.01); *H03H 7/1758* (2013.01); *H03H 7/0107* (2013.01); *H03H 2001/0085* (2013.01)

(58) Field of Classification Search
USPC .... 333/177, 185; 336/200; 361/306.3, 301.1
See application file for complete search history.

(56) References Cited

U.S. PATENT DOCUMENTS

2012/0092091 A1* 4/2012 Kang .................. H01P 3/123
333/239

2012/0194963 A1* 8/2012 Kuroda .................. H01G 4/012
361/301.4

FOREIGN PATENT DOCUMENTS

| | | |
|---|---|---|
| JP | H04-267615 A | 9/1992 |
| JP | H05-009025 U | 2/1993 |
| JP | H05-095031 U | 12/1993 |
| JP | H05-335866 A | 12/1993 |
| JP | H07-302738 A | 11/1995 |
| JP | H09-270657 A | 10/1997 |
| JP | 2001-176728 A | 6/2001 |
| JP | 2004-297551 A | 10/2004 |
| JP | 2005-347782 A | 12/2005 |
| JP | 2006-287427 A | 10/2006 |
| JP | 2007-306391 A | 11/2007 |

OTHER PUBLICATIONS

Written Opinion issued in Application No. PCT/JP2013/082928 dated Mar. 11, 2014.
Notice of Reason for Rejection issued in corresponding Japanese Patent Application No. 2014-558459 dated Oct. 27, 2015.

* cited by examiner

FIG. 6
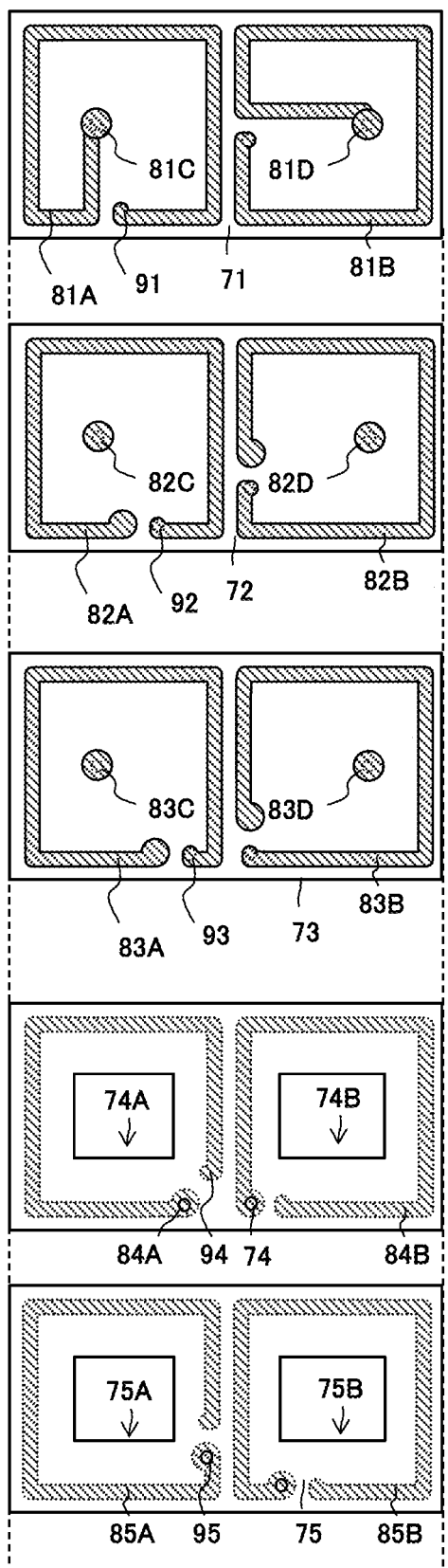
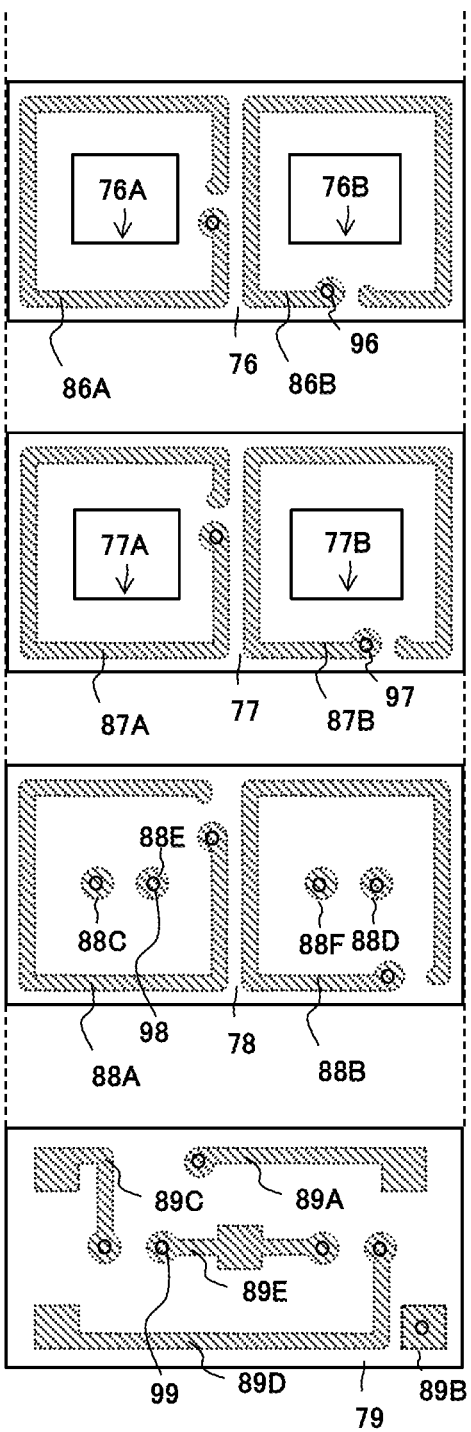

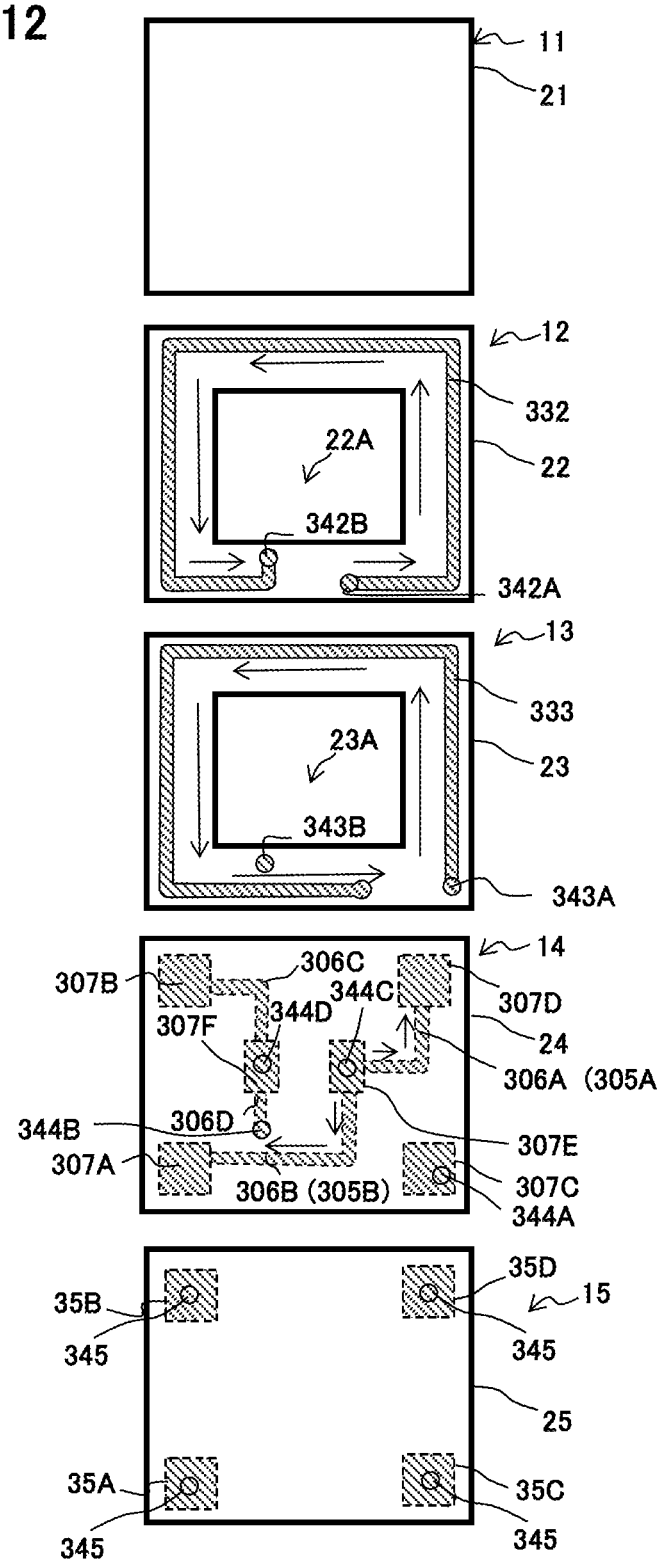

LC COMPOSITE COMPONENT

BACKGROUND OF THE INVENTION

1. Field of the Invention

The present disclosure relates to an LC composite component configured such that a coil and a chip capacitive element are arranged in a multi-layer substrate having a plurality of insulating layers stacked on each other.

2. Description of the Related Art

There is an LC composite component that is configured as an LC filter in which a coil and a capacitor that are formed by an electrode pattern are disposed between layers in a multi-layer substrate are connected (see JP 5-335866 A).

According to a conventional LC composite component, a magnetic field generated within a multi-layer substrate becomes stronger as the magnetic field is closer to a coil. Therefore, if an electrode pattern such as a capacitor is disposed near the coil, a magnetic flux travels around the electrode pattern, and thus an inductance of the coil is reduced. Accordingly, in order to set an inductance to a desired value without changing a configuration of the coil too largely, it may be desirable to place an electrode pattern such as a capacitor away from the vicinity of the coil so as to prevent reduction of the inductance. In addition, it may be desirable to increase an area of the multi-layer substrate in order to place the electrode pattern such as a capacitor away from the vicinity of the coil. Therefore, it can be difficult to produce downsized LC composite components.

SUMMARY OF THE INVENTION

Thus, the present disclosure provides an LC composite component with which a desired inductance may be easily achieved and that is suitable for downsizing as compared to the conventional technique.

An LC composite component according to the present disclosure includes: a multi-layer substrate configured such that a plurality of insulating layers are stacked on each other; a pattern coil forming a coiled shape of which the coil axis extends along a stacking direction of the multi-layer substrate, and including a conductor disposed between the insulating layers; and a chip capacitive element including a dielectric body having a relative permittivity higher than that of the insulating layers and counter electrodes that face against each other with the dielectric body interposed therebetween, at least a part of the chip capacitive element being disposed within the pattern coil.

According to this configuration, at least a part of the chip capacitive element is disposed within the pattern coil, and therefore it is possible to reduce a space for providing the chip capacitive element and to downsize the LC composite component. Further, as the chip capacitive element is configured to include a dielectric body having a higher relative permittivity than that of the insulating layers of the multi-layer substrate, it is possible to downsize the chip capacitive element, and to prevent reduction of an inductance of the pattern coil as an amount of the magnetic flux blocked by the chip capacitive element decreases even if the chip capacitive element is disposed within the pattern coil.

It may be preferable that the above LC composite component is configured such that the chip capacitive element is disposed such that each of the counter electrodes is in parallel with the stacking direction of the multi-layer substrate.

A direction of magnetic flux within the pattern coil substantially matches the stacking direction of the multi-layer substrate. Therefore, by arranging the counter electrodes of the chip capacitive element in parallel with the stacking direction of the multi-layer substrate, the magnetic flux passes between the counter electrodes of the chip capacitive element. This also reduces an amount of the magnetic flux blocked by the chip capacitive element, and thus it is possible to prevent reduction of an inductance of the pattern coil.

It may be preferable that the above LC composite component is configured such that one principal surface facing the stacking direction of the multi-layer substrate is a mounting surface facing an external substrate, and a center of the chip capacitive element in the stacking direction of the multi-layer substrate is displaced toward a side of the mounting surface from a center of the pattern coil in the stacking direction of the multi-layer substrate.

The external substrate on which the LC composite component is mounted is typically provided with a ground electrode or a mounting electrode in a region that face the LC composite component. With this, in a state in which the LC composite component is mounted on the external substrate, a magnetic field generated by the pattern coil becomes weaker on a side closer to the mounting surface. Therefore, by displacing the center of the chip capacitive element in the stacking direction of the multi-layer substrate to the side of the mounting surface from the center of the pattern coil in the stacking direction of the multi-layer substrate, it is possible to reduce an amount of the magnetic flux blocked by the chip capacitive element, and to prevent reduction of an inductance of the pattern coil.

It may be preferable that the above LC composite component is configured such that the chip capacitive element includes a mounting electrode facing the stacking direction of the multi-layer substrate, the multi-layer substrate includes via conductors respectively on top and bottom in the stacking direction of the multi-layer substrate with respect to the chip capacitive element, the via conductors extending from the mounting electrode along the stacking direction of the multi-layer substrate as a part of wiring connected to the chip capacitive element, and the mounting electrode is connected between the via conductors.

According to this configuration, when viewed along the stacking direction of the multi-layer substrate, the mounting electrode of the chip capacitive element overlap the via conductor connected to the chip capacitive element. Therefore, it is possible to use the mounting electrode as a part of the via conductor, and it is possible to reduce an area of the electrode provided within the pattern coil when viewed along the stacking direction of the multi-layer substrate. With this, it is possible to reduce an amount of the magnetic flux blocked by the electrode, and to prevent reduction of an inductance of the pattern coil.

It may be preferable that the above LC composite component further includes: a second pattern coil where the pattern coil is taken as a first pattern coil, the second pattern coil being adjacent to the first pattern coil on a side perpendicular to the stacking direction of the multi-layer substrate, and forming a coiled shape of which the coil axis extends along the stacking direction of the multi-layer substrate, and is configured such that a direction of magnetic flux within the first pattern coil is identical with a direction of magnetic flux within the second pattern coil, and a center of the chip capacitive element in a direction along which the first pattern coil and the second pattern coil are adjacent is displaced toward a side of the second pattern coil from a center of the first pattern coil.

According to this configuration, as the direction of magnetic flux within the first pattern coil is identical with the direction of magnetic flux within the second pattern coil, the magnetic field within the first pattern coil becomes weaker closer to the second pattern coil. Therefore, by displacing the chip capacitive element to the side of the second pattern coil from the center of the first pattern coil, it is possible to reduce an amount of the magnetic flux blocked by the chip capacitive element, and to prevent reduction of an inductance of the first pattern coil.

It may be preferable that the above LC composite component further includes: a second pattern coil where the pattern coil is taken as a first pattern coil, the second pattern coil being adjacent to the first pattern coil on a side perpendicular to the stacking direction of the multi-layer substrate, and forming a coiled shape of which the coil axis extends along the stacking direction of the multi-layer substrate, and is configured such that a direction of magnetic flux within the first pattern coil is opposite from a direction of magnetic flux within the second pattern coil, and a center of the chip capacitive element in a direction along which the first pattern coil and the second pattern coil are adjacent is displaced toward a side opposite from the second pattern coil from a center of the first pattern coil.

According to this configuration, as the direction of magnetic flux within the first pattern coil is opposite from the direction of magnetic flux within the second pattern coil, the magnetic field within the first pattern coil becomes stronger closer to the second pattern coil. Therefore, by displacing the chip capacitive element to the side opposite from the second pattern coil from the center of the first pattern coil, it is possible to reduce an amount of the magnetic flux blocked by the chip capacitive element, and to prevent reduction of an inductance of the first pattern coil.

The LC composite component may be configured such that a filter circuit is configured by connecting the pattern coil and the chip capacitive element.

The LC composite component may be configured such that the chip capacitive element is a chip capacitor.

The LC composite component may be configured such that the chip capacitive element is a chip varistor.

It may be preferable that the above LC composite component further includes: a first inductor configured by a conductor extending and facing the first pattern coil between the insulating layers, and connected to the pattern coil via the chip capacitive element.

According to this configuration, magnetic field coupling occurs between the first inductor and the pattern coil, and it is possible to adjust inductance of the pattern coil by the magnetic field coupling.

It may be preferable that the above LC composite component further includes: a first signal input/output terminal; a second signal input/output terminal; and a ground connecting electrode, and is configured such that the pattern coil is connected between the first signal input/output terminal and the second signal input/output terminal, the chip capacitive element has one end connected to a connecting point between the pattern coil and the second signal input/output terminal, and the first inductor is connected between the other end of the chip capacitive element and the ground connecting electrode.

According to this configuration, an attenuation pole may be provided for filter characteristics by series resonance between the chip capacitive element and the first inductor.

The LC composite component may be configured such that in a region in which the first inductor faces the pattern coil, a direction of a current flowing through the first inductor is the same as a direction of a current flowing through the pattern coil. In this case, magnetic field coupling is achieved between the first inductor and the pattern coil in phase by a positive coupling factor.

The LC composite component may be configured such that in a region in which the first inductor faces the pattern coil, a direction of a current flowing through the first inductor is opposite from a direction of a current flowing through the pattern coil. In this case, magnetic field coupling is achieved between the first inductor and the pattern coil in reversed phase by a negative coupling factor.

It may be preferable that the above LC composite component further includes: a second inductor configured by a conductor extending and facing the first pattern coil between the insulating layers, and connected to the first inductor in parallel.

According to this configuration, it is possible to adjust magnetic field coupling between the pattern coil for each of the first inductor and the second inductor, and therefore inductance of the pattern coil may be more accurately adjusted.

The LC composite component may be configured such that in a region in which the second inductor faces the pattern coil, a direction of a current flowing through the second inductor is the same as a direction of a current flowing through the pattern coil. In this case, magnetic field coupling is achieved between the second inductor and the pattern coil in phase by a positive coupling factor.

The LC composite component may be configured such that in a region in which the second inductor faces the pattern coil, a direction of a current flowing through the second inductor is opposite from a direction of a current flowing through the pattern coil. In this case, magnetic field coupling is achieved between the second inductor and the pattern coil in reversed phase by a negative coupling factor.

According to the LC composite component of the present disclosure, it is possible to downsize the LC composite component as a chip capacitive element is provided within a pattern coil. Further, as the chip capacitive element may be downsized by configuring the chip capacitive element using a dielectric layer having a higher relative permittivity than that of an insulating layer, it is possible to prevent reduction of an inductance of a pattern coil even if the chip capacitive element is disposed within the pattern coil. Therefore, it is possible to easily achieve a desired inductance even with a downsized LC composite component.

BRIEF DESCRIPTION OF THE DRAWINGS

FIG. 6 is an exploded plan view of the LC composite component according to the second embodiment of the present disclosure;

FIG. 12 is an exploded plan view of the LC composite component according to the sixth embodiment of the present disclosure;

DETAILED DESCRIPTION OF THE INVENTION

Hereinafter, an LC composite component according to a first embodiment will be described. The LC composite component as used herein is connected to an external connecting terminal of a device utilizing high-frequency signals, and used as a filter for removing a noise.

Figure 1A:
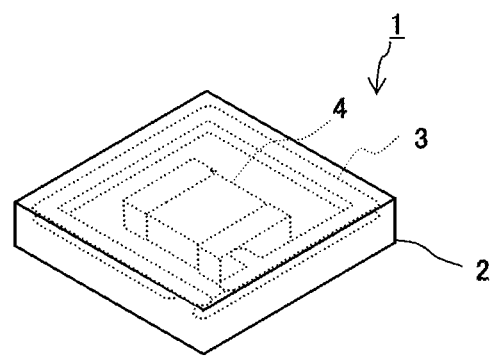
FIG. 1A is a perspective view illustrating an LC composite component according to a first embodiment of the present disclosure.

FIG. 1A is a perspective view illustrating an LC composite component 1 according to the first embodiment.

The LC composite component 1 includes a multi-layer substrate 2, a pattern coil 3, and a chip capacitive element 4. The multi-layer substrate 2 is a hexahedron, and configured herein by a thermoplastic resin such as liquid crystal polymers. The chip capacitive element 4 here is a chip capacitor. The pattern coil 3 and the chip capacitive element 4 are disposed within the multi-layer substrate 2. The multi-layer substrate may be configured by a different type of thermoplastic resin or low temperature co-fired ceramics, for example.

Figure 1B:
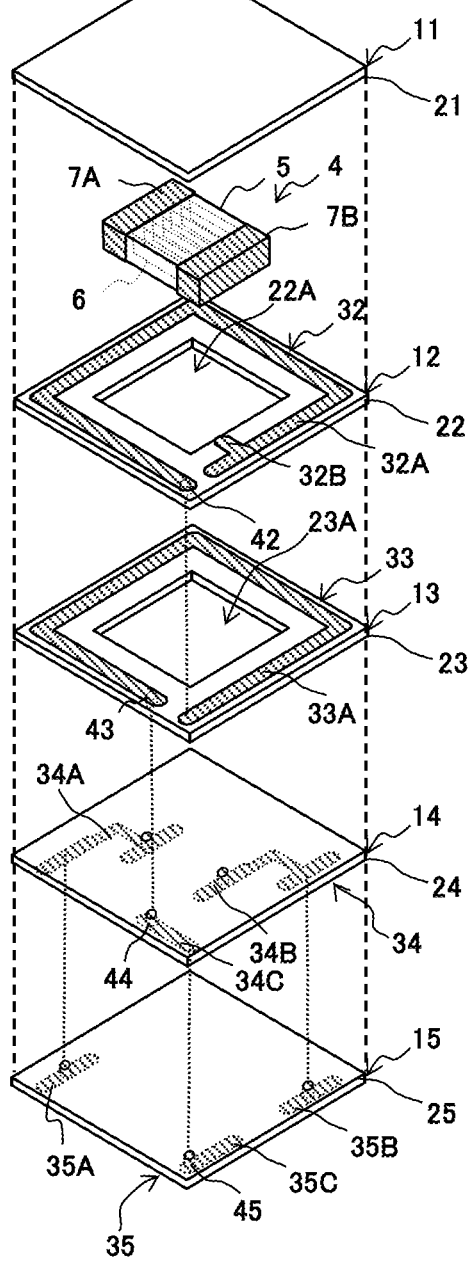
FIG. 1B is an exploded perspective view of the LC composite component according to the first embodiment of the present disclosure.
Figure 2:
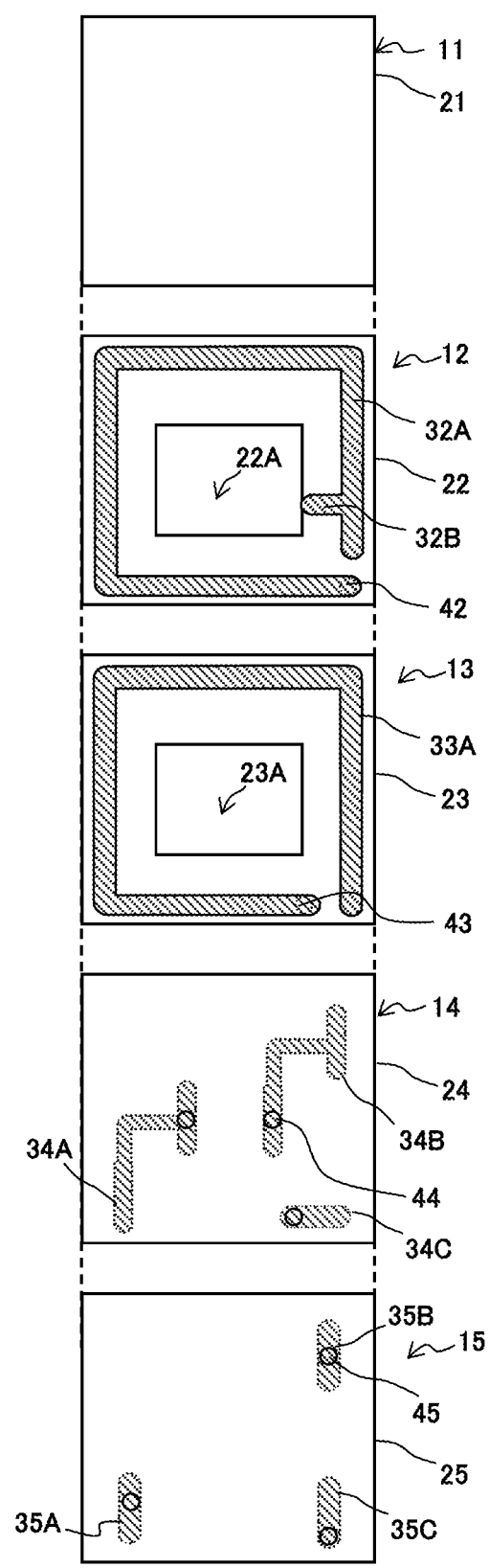
FIG. 2 is an exploded plan view of the LC composite component according to the first embodiment of the present disclosure.

FIG. 1B is an exploded perspective view of the LC composite component 1. FIG. 2 is an exploded plan view of the LC composite component 1 viewing respective layers from their top surfaces.

The multi-layer substrate 2 includes resin sheets 11, 12, 13, 14, and 15. The multi-layer substrate 2 is configured such that the resin sheets 11-15 are stacked from a top surface to a bottom surface in order.

The resin sheet 11 includes an insulating layer 21. The insulating layer 21 is made of a resin, and its outline is rectangular in a planar view along a stacking direction.

The resin sheet 12 includes an insulating layer 22, a wiring layer 32, and a via conductor 42. The insulating layer 22 is made of a resin and includes an opening 22A. An outline of the insulating layer 22 is rectangular in a planar view along the stacking direction. The opening 22A is rectangular in a planar view, and penetrates the insulating layer 22 from the top surface to the bottom surface. The wiring layer 32 is stacked over the top surface of the insulating layer 22. The via conductor 42 penetrates the insulating layer 22 from the top surface to the bottom surface.

The resin sheet 13 includes an insulating layer 23, a wiring layer 33, and a via conductor 43. The insulating layer 23 is made of a resin and includes an opening 23A. An outline of the insulating layer 23 is rectangular in a planar view along the stacking direction. The opening 23A is rectangular in a planar view, and penetrates the insulating layer 23 from the top surface to the bottom surface. The wiring layer 33 is stacked over the top surface of the insulating layer 23. The via conductor 43 penetrates the insulating layer 23 from the top surface to the bottom surface.

The resin sheet 14 includes an insulating layer 24, a wiring layer 34, and a via conductor 44. The insulating layer 24 is made of a resin, and its outline is rectangular in a planar view along the stacking direction. The wiring layer 34 is stacked over the bottom surface of the insulating layer 24. The via conductor 44 penetrates the insulating layer 24 from the top surface to the bottom surface.

The resin sheet 15 includes an insulating layer 25, a wiring layer 35, and a via conductor 45. The insulating layer 25 is made of a resin, and its outline is rectangular in a planar view along the stacking direction. The wiring layer 35 is stacked over the bottom surface of the insulating layer 25. The via conductor 45 penetrates the insulating layer 25 from the top surface to the bottom surface.

The pattern coil 3 includes a coil conductor 32A and a coil conductor 33A, and has an inductance. The coil conductor 32A is provided over the wiring layer 32 of the resin sheet 12, and extends so as to surround the opening 22A. The coil conductor 33A is provided over the wiring layer 33 of the resin sheet 13, and extends so as to surround the opening 23A. The coil conductor 32A and the coil conductor 33A are connected by the via conductor 42 so as to form a coiled shape of which the coil axis extends along the stacking direction of the multi-layer substrate 2.

The chip capacitive element 4 has a thickness substantially equal to a total thickness of the resin sheets 12 and 13, and is contained within a cavity defined by the openings 22A and 23A. As the openings 22A and 23A are provided within the coil conductors 32A and 33A, the chip capacitive element 4 is disposed within a coil of the pattern coil 3.

The chip capacitive element 4 includes a ceramic body 5, a plurality of counter electrodes 6, and mounting electrodes 7A and 7B, and has a capacitance. The ceramic body 5 is configured such that a plurality of dielectric layers having a higher relative permittivity than that of the insulating layers 21-25 that constitute the multi-layer substrate 2 are stacked in a direction perpendicular to the stacking direction of the multi-layer substrate 2. The plurality of counter electrodes 6 are disposed within the ceramic body 5 so as to face against each other with the dielectric layers interposed therebetween. Specifically, the counter electrodes 6 are respectively arranged in parallel to the stacking direction of the multi-layer substrate 2. The mounting electrodes 7A and 7B are provided for an outer surface of the ceramic body 5 at positions near its both ends, and respectively connected to the plurality of counter electrodes 6 alternately. More specifically, the mounting electrodes 7A and 7B are respectively disposed along surfaces facing the stacking direction of the multi-layer substrate 2, via the end surfaces being perpendicular to the surfaces in the stacking direction of the ceramic body 5 and to the surfaces in the stacking direction of the multi-layer substrate 2.

Further, the wiring layer 32 of the resin sheet 12 is provided with a connected conductor 32B. The connected conductor 32B is an electrode connecting the mounting electrode 7B of the chip capacitive element 4 and the coil conductor 32A of the pattern coil 3.

Moreover, the wiring layer 34 of the resin sheet 14 is provided with connected conductors 34A, 34B, and 34C. The connected conductor 34A is an electrode to which the mounting electrode 7A of the chip capacitive element 4 is connected by the via conductor 44 of the resin sheet 14. The connected conductor 34B is an electrode to which the mounting electrode 7B of the chip capacitive element 4 is connected by the via conductor 44 of the resin sheet 14. The connected conductor 34C is an electrode to which the coil conductor 33A of the pattern coil 3 is connected by the via conductor 44 of the resin sheet 14 and the via conductor 43 of the resin sheet 13.

Furthermore, the wiring layer 35 of the resin sheet 15 is provided with mounting electrodes 35A, 35B, and 35C. The mounting electrode 35A is an electrode connected to the connected conductor 34A of the resin sheet 14 by the via conductor 45 of the resin sheet 15, and connected to an electrode of the external substrate that is not depicted. Specifically, the mounting electrode 35A is connected to the mounting electrode 7A of the chip capacitive element 4 via the connected conductor 34A.

The mounting electrode 35B is an electrode connected to the connected conductor 34B of the resin sheet 14 by the via conductor 45 of the resin sheet 15, and connected to an electrode of the external substrate that is not depicted. Specifically, the mounting electrode 35B is connected to the mounting electrode 7B of the chip capacitive element 4 via the connected conductor 34B.

The mounting electrode 35C is an electrode connected to the connected conductor 34C of the resin sheet 14 by the via conductor 45 of the resin sheet 15, and connected to an electrode of the external substrate that is not depicted. Specifically, the mounting electrode 35C is connected to the coil conductor 33A of the pattern coil 3 via the connected conductor 34C.

Figure 3:
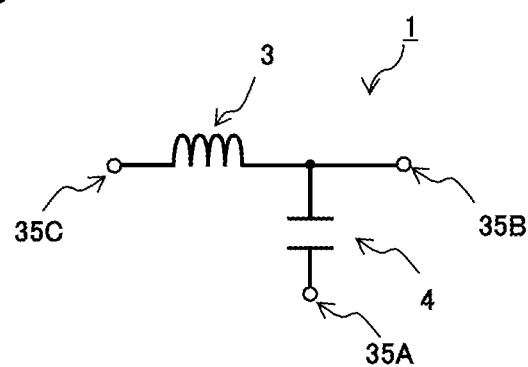
FIG. 3 is an equivalent circuit schematic of the LC composite component according to the first embodiment of the present disclosure.

FIG. 3 is an equivalent circuit schematic of the LC composite component 1.

The pattern coil 3 and the chip capacitive element 4 are connected in series. The pattern coil 3 is also connected between the mounting electrode 35B and the mounting electrode 35C. The chip capacitive element 4 is connected between the mounting electrode 35B and the mounting electrode 35A. The LC composite component 1 constitutes a filter circuit, and functions as a low-pass filter (LPF) by using the mounting electrode 35A as a ground connecting electrode and the mounting electrodes 35B and 35C as signal input/output terminals, for example.

FIGS. 4A, 4B, 4C, 4D, and 4E are side sectional views illustrating an example of steps of manufacturing the LC composite component 1. In the figures, a portion that constitutes a single LC composite component 1 is illustrated. The LC composite component 1 may be manufactured by producing a plurality of LC composite components 1 at the same time by providing a large number of LC composite components 1 over a large resin sheet, and then dicing the sheet into individual LC composite components 1.

Figure 4A:
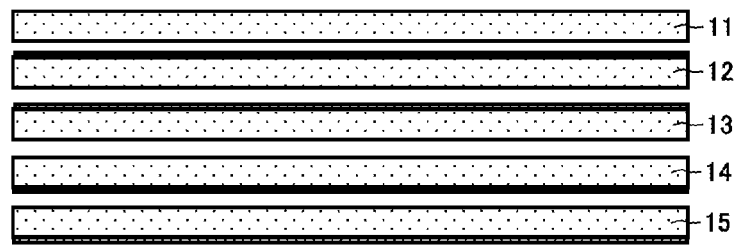
FIGS. 4A, 4B, 4C, 4D, and 4E are side sectional views respectively illustrating steps of manufacturing the LC composite component according to the first embodiment of the present disclosure.

First, in a first step shown in FIG. 4A, the resin sheet 11 having an insulating layer and the resin sheets 12-15 each having a metallic film entirely over one side of an insulating layer are prepared. As the metallic film, a metallic foil such as a copper foil is used, for example.

Figure 4B:
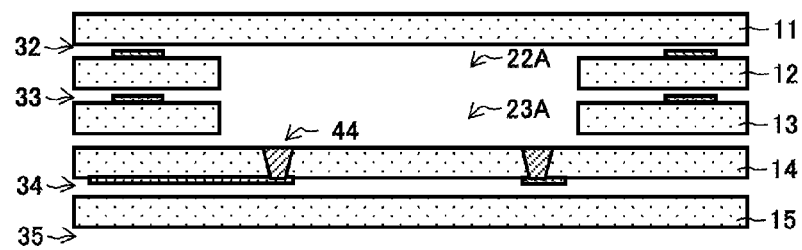

Next, in a second step shown in FIG. 4B, the metallic films of the resin sheets 12-15 are patterned by etching or the like to form the wiring layers 32-35. Further, the openings 22A and 23A are defined respectively in the insulating layers of the resin sheets 12 and 13 by punching or the like. In addition, the via conductors 42-45 are provided respectively in the insulating layers of the resin sheets 12-15, each via conductor being provided by defining a penetrating hole that penetrates the insulating layer but not the metallic film by laser or the like, and by providing a conductive material such as a conductive paste within the penetrating hole.

Figure 4C:
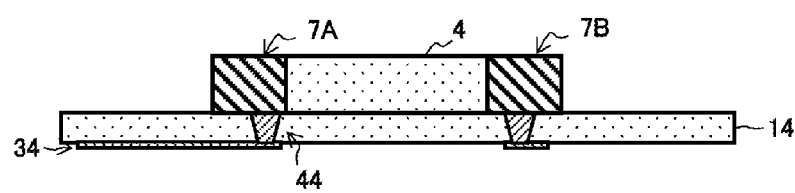

Thereafter, in a third step shown in FIG. 4C, in a state in which the wiring layer 34 of the resin sheet 14 faces a side of the bottom surface, the chip capacitive element 4 is disposed on a side of the top surface of the resin sheet 14, the chip capacitive element 4 is bonded to the resin sheet 14 by thermocompression bonding. With this, the mounting electrodes 7A and 7B of the chip capacitive element 4 are joined to the via conductor 44 of the resin sheet 14.

Figure 4D:
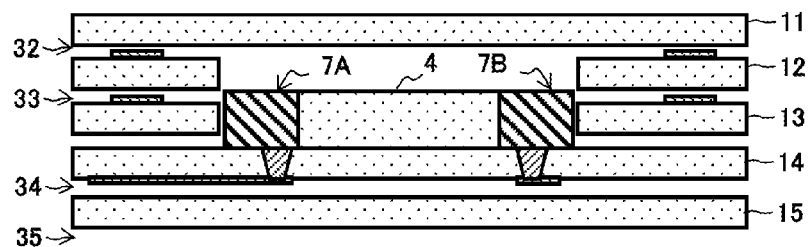

Next, in a fourth step shown in FIG. 4D, the resin sheets 11-15 are stacked in a state in which the wiring layer 32 of the resin sheet 12 faces a side of the top surface, the wiring layer 33 of the resin sheet 13 faces the side of the top surface, the wiring layer 34 of the resin sheet 14 faces the side of the bottom surface, and the wiring layer 35 of the resin sheet 15 faces the side of the bottom surface.

Figure 4E:
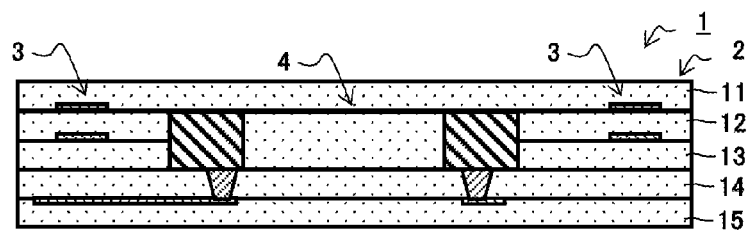

Then, in a fifth step shown in FIG. 4E, the resin sheets 11-15 are bonded by thermocompression bonding. With this, the resin sheets 11-15 are joined with each other, and the LC composite component 1 is manufactured.

As described above, the LC composite component 1 according to this embodiment is configured such that the chip capacitive element 4 is disposed within the pattern coil 3. Therefore, it is possible to reduce a space for providing the chip capacitive element 4 in the LC composite component 1. With this, the LC composite component 1 as a whole may be made smaller as compared to a case in which the chip capacitive element 4 is disposed outside the pattern coil 3. Further, by using a thermoplastic resin for the multi-layer substrate 2, it is possible to make a thermoplastic resin to flow at the same time as thermocompression bonding, and it is possible to fill a cavity portion due to the openings 22A and 23A within the multi-layer substrate 2, and to steadily fix integrated components such as the chip capacitive element 4. Moreover, by covering a fragile ceramic body of the chip capacitive element 4 with a resin of the multi-layer substrate 2, it is possible to make the ceramic body of the chip capacitive element 4 less susceptible to fracture on impact.

As the chip capacitive element 4 is disposed within the pattern coil 3, there is possibly a case in which a magnetic flux of the pattern coil 3 is blocked by the chip capacitive element 4, and the inductance of the pattern coil 3 reduces.

However, in this embodiment, the chip capacitive element 4 includes the ceramic body 5 made of a dielectric layer having a higher relative permittivity than that of the multi-layer substrate 2, and therefore it is possible to make the chip capacitive element 4 smaller as compared to a case in which the chip capacitive element 4 includes a dielectric layer having a relative permittivity that is substantially the same as that of the multi-layer substrate 2. Accordingly, an amount of the magnetic flux blocked by the chip capacitive element 4 disposed within the pattern coil 3 decreases.

It should be noted that it is possible to provide a small capacitive element also in a case in which counter electrodes based on a pattern is provided for the wiring layer of the multi-layer substrate 2, and the multi-layer substrate 2 as a whole is configured by a layer having a high relative permittivity. However, in this case, characteristics such as an inductance may adversely deteriorate as the pattern coil 3 is also formed on the multi-layer substrate 2 having a high relative permittivity. Therefore, as in this embodiment, it is possible to downsize the LC composite component 1 while achieving both a high inductance and a high capacitance by configuring a capacitive element that is desired to have a high relative permittivity by a dielectric layer having a high relative permittivity and a pattern coil portion by a layer having a relative permittivity relatively lower than the dielectric layer.

Further, the chip capacitive element 4 is arranged such that the stacking direction of the ceramic body 5 is perpendicular to the stacking direction of the multi-layer substrate 2, that is, such that the counter electrodes 6 are respectively disposed in parallel with the stacking direction of the multi-layer substrate 2. As a result, a direction of magnetic flux within the pattern coil 3 substantially matches the stacking direction of the multi-layer substrate 2, and the magnetic flux of the pattern coil 3 passes through the ceramic body 5 of the chip capacitive element 4 while scarcely hitting against the counter electrodes 6. Alternatively, the counter electrodes 6 may not be respectively disposed in parallel with the stacking direction of the multi-layer substrate 2. For example, the counter electrodes 6 may be respectively disposed in parallel with a planar surface of the multi-layer substrate 2.

Further, within the pattern coil 3, the via conductor 44 of the resin sheet 14 is provided so as to overlap the mounting electrodes 7A and 7B of the chip capacitive element 4, when viewed along the stacking direction of the multi-layer substrate 2. Therefore, as compared to a case in which the via conductor is displaced from the mounting electrodes 7A and 7B of the chip capacitive element 4, an amount of the magnetic flux blocked by the via conductor 44 decreases.

Moreover, in the LC composite component 1 thus configured, its bottom surface constitutes a mounting surface to an external substrate. In general, a region of the external substrate that faces the LC composite component 1 is provided with a ground electrode and a mounting electrode. Therefore, in a state in which the LC composite component 1 is mounted on the external substrate, a magnetic field generated by the pattern coil 3 of the LC composite component 1 becomes weaker on a side of the bottom surface than on a side of the top surface.

As illustrated in FIG. 4E, in the LC composite component 1, along the stacking direction of the multi-layer substrate 2, a center of the pattern coil 3 is near a center of the resin sheet 12 in a thickness direction, and a center of the chip capacitive element 4 is near a boundary between the resin sheet 12 and the resin sheet 13. Specifically, along the stacking direction of the multi-layer substrate 2, the center of the chip capacitive element 4 is displaced to the side of the bottom surface from the center of the pattern coil 3. Therefore, the chip capacitive element 4 is placed in a region where the magnetic field of the pattern coil 3 is weak. With this, a loop of the magnetic field may not be prevented in a region on the side of the top surface where the magnetic field is strong.

As a result, it is possible to prevent an inductance of the pattern coil 3 from decreasing. Therefore, it is easily possible to achieve a desired inductance of the pattern coil 3, even if the chip capacitive element 4 is disposed within the pattern coil 3 to make the LC composite component 1 small.

Next, an LC composite component 51 according to a second embodiment of the present disclosure will be described.

Figure 5:
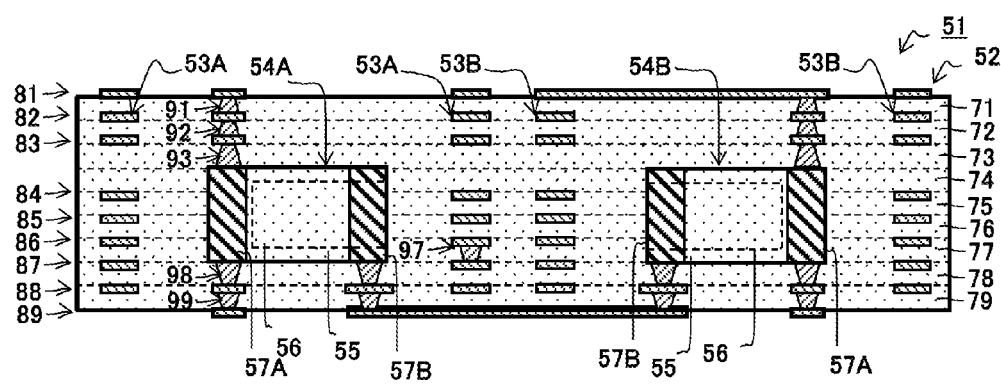
FIG. 5 is a side sectional view illustrating an LC composite component according to a second embodiment of the present disclosure.

FIG. 5 is a side sectional view illustrating the LC composite component 51. FIG. 6 is an exploded plan view of the LC composite component 51 in which its layers are viewed in a planar view from their top surfaces.

The LC composite component 51 includes a multi-layer substrate 52, pattern coils 53A and 53B, and chip capacitive elements 54A and 54B. The chip capacitive elements 54A and 54B here are chip capacitors. The pattern coils 53A and 53B and the chip capacitive elements 54A and 54B are disposed within the multi-layer substrate 52.

The multi-layer substrate 52 includes insulating layers 71, 72, 73, 74, 75, 76, 77, 78, and 79. The multi-layer substrate 52 is configured such that the insulating layers 71-79 are stacked from a top surface to a bottom surface in order.

The insulating layer 71 is made of a resin, has a rectangular outline in a planar view along the stacking direction, includes a wiring layer 81 stacked over the top surface and a via conductor 91 penetrating from the top surface to the bottom surface. The insulating layer 72 is made of a resin, has a rectangular outline in a planar view along the stacking direction, includes a wiring layer 82 stacked over the top surface and a via conductor 92 penetrating from the top surface to the bottom surface. The insulating layer 73 is made of a resin, has a rectangular outline in a planar view along the stacking direction, includes a wiring layer 83 stacked over the top surface and a via conductor 93 penetrating from the top surface to the bottom surface. The insulating layer 74 is made of a resin, has a rectangular outline in a planar view along the stacking direction, includes a wiring layer 84 stacked over the bottom surface as well as a via conductor 94 and openings 74A and 74B penetrating from the top surface to the bottom surface. The insulating layer 75 is made of a resin, has a rectangular outline in a planar view along the stacking direction, includes a wiring layer 85 stacked over the bottom surface as well as a via conductor 95 and openings 75A and 75B penetrating from the top surface to the bottom surface. The insulating layer 76 is made of a resin, has a rectangular outline in a planar view along the stacking direction, includes a wiring layer 86 stacked over the bottom surface as well as a via conductor 96 and openings 76A and 76B penetrating from the top surface to the bottom surface. The insulating layer 77 is made of a resin, has a rectangular outline in a planar view along the stacking direction, includes a wiring layer 87 stacked over the bottom surface as well as a via conductor 97 and openings 77A and 77B penetrating from the top surface to the bottom surface. The insulating layer 78 is made of a resin, has a rectangular outline in a planar view along the stacking direction, includes a wiring layer 88 stacked over the bottom surface as well as a via conductor 98 penetrating from the top surface to the bottom surface. The insulating layer 79 is made of a resin, has a rectangular outline in a planar view along the stacking direction, includes a wiring layer 89 stacked over the bottom surface as well as a via conductor 99 penetrating from the top surface to the bottom surface.

The pattern coil 53A includes coil conductors 81A, 82A, 83A, 84A, 85A, 86A, 87A, and 88A, and has an inductance. The pattern coil 53B includes coil conductors 81B, 82B, 83B, 84B, 85B, 86B, 87B, and 88B, and has an inductance.

The coil conductors 81A and 81B are provided for the wiring layer 81, and applied to the top surface of the insulating layer 71. The coil conductors 82A and 82B are provided for the wiring layer 82, and applied to the top surface of the insulating layer 72. The coil conductors 83A and 83B are provided for the wiring layer 83, and applied to the top surface of the insulating layer 73. The coil conductors 84A and 84B are provided for the wiring layer 84, and applied to the bottom surface of the insulating layer 74. The coil conductors 85A and 85B are provided for the wiring layer 85, and applied to the bottom surface of the insulating layer 75. The coil conductors 86A and 86B are provided for the wiring layer 86, and applied to the bottom surface of the insulating layer 76. The coil conductors 87A and 87B are provided for the wiring layer 87, and applied to the bottom surface of the insulating layer 77. The coil conductors 88A and 88B are provided for the wiring layer 88, and applied to the bottom surface of the insulating layer 78.

The openings 74A, 75A, 76A, and 77A are disposed so as to overlap each other when viewed along the stacking direction of the multi-layer substrate 52. The coil conductors 81A, 82A, 83A, 84A, 85A, 86A, 87A, and 88A extend so as to surround the openings 74A, 75A, 76A, and 77A when viewed along the stacking direction of the multi-layer substrate 52. Further, the coil conductors 81A, 82A, 83A, 84A, 85A, 86A, 87A, and 88A are connected by the via conductors 91, 92, 93, 94, 95, 96, 97, and 98 so as to form a coiled shape of which the coil axis extends along the stacking direction of the multi-layer substrate 52.

Moreover, the openings 74B, 75B, 76B, and 77B are disposed so as to overlap each other when viewed along the stacking direction of the multi-layer substrate 52. The coil conductors 81B, 82B, 83B, 84B, 85B, 86B, 87B, and 88B extend so as to surround the openings 74B, 75B, 76B, and 77B when viewed along the stacking direction of the multi-layer substrate 52. Further, the coil conductors 81B, 82B, 83B, 84B, 85B, 86B, 87B, and 88B are connected by the via conductors 91, 92, 93, 94, 95, 96, 97, and 98 so as to form a coiled shape of which the coil axis extends along the stacking direction of the multi-layer substrate 52.

The chip capacitive element 54A has a thickness substantially equal to a total thickness of the insulating layers 74, 75, 76, and 77, and is contained within a cavity defined by the openings 74A, 75A, 76A, and 77A. As the openings 74A, 75A, 76A, and 77A are provided within the coil conductors 81A, 82A, 83A, 84A, 85A, 86A, 87A, and 88A, the chip capacitive element 54A is disposed within the pattern coil 53A.

The chip capacitive element 54B has a thickness substantially equal to a total thickness of the insulating layers 74, 75, 76, and 77, and is contained within a cavity defined by the openings 74B, 75B, 76B, and 77B. As the openings 74B, 75B, 76B, 77B are provided within the coil conductors 81B, 82B, 83B, 84B, 85B, 86B, 87B, and 88B, the chip capacitive element 54B is disposed within the pattern coil 53B.

Further, as illustrated in FIG. 5, each of the chip capacitive elements 54A and 54B includes a ceramic body 55, a plurality of counter electrodes 56, and mounting electrodes 57A and 57B, and has a capacitance. The ceramic body 55 is configured such that dielectric layers having a higher relative permittivity than that of the insulating layers that constitute the multi-layer substrate 52 are stacked in a direction perpendicular to the stacking direction of the multi-layer substrate 52. The plurality of counter electrodes 56 are disposed within the ceramic body 55 so as to face against each other with the dielectric layers interposed therebetween, and correspond to counter electrodes defined in the scope of the disclosure. Specifically, the counter electrodes 56 are arranged in parallel to the stacking direction of the multi-layer substrate 52. The mounting electrodes 57A and 57B are provided for an outer surface of the ceramic body 55 at positions near both of its ends, and respectively connected to the plurality of counter electrodes 56 alternately. More specifically, the mounting electrodes 57A and 57B are respectively disposed along surfaces facing the stacking direction of the multi-layer substrate 52, via the end surfaces being perpendicular to the surfaces in the stacking direction of the ceramic body 55 and to the surfaces in the stacking direction of the multi-layer substrate 52.

Further, as illustrated in FIG. 6, the wiring layer 81 is provided with connected conductors 81C and 81D. The wiring layer 82 is provided with connected conductors 82C and 82D. The wiring layer 83 is provided with connected conductors 83C and 83D. The wiring layer 88 is provided with connected conductors 88C, 88D, 88E, and 88F. The wiring layer 89 is provided with mounting electrodes 89A, 89B, 89C, 89D, and 89E.

The connected conductors 81C, 82C, and 83C are electrodes connecting the mounting electrode 57A of the chip capacitive element 54A and the coil conductor 81A of the pattern coil 53A by the via conductors 91, 92, and 93, as illustrated in FIG. 5. The connected conductors 81D, 82D, and 83D are electrodes connecting the mounting electrode 57A of the chip capacitive element 54B and the coil conductor 81B of the pattern coil 53B by the via conductors 91, 92, and 93.

The connected conductor 88C is an electrode connected to the mounting electrode 57A of the chip capacitive element 54A by the via conductor 98. The connected conductor 88D is an electrode connected to the mounting electrode 57A of the chip capacitive element 54B by the via conductor 98. The connected conductor 88E is an electrode connected to the mounting electrode 57B of the chip capacitive element 54A by the via conductor 98. The connected conductor 88F is an electrode connected to the mounting electrode 57B of the chip capacitive element 54B by the via conductor 98.

The mounting electrode 89A is an electrode connected to the coil conductor 88A by the via conductor 99, and connected to an electrode of the external substrate that is not depicted. The mounting electrode 89B is an electrode connected to the coil conductor 88B by the via conductor 99, and connected to an electrode of the external substrate that is not depicted. The mounting electrode 89C is an electrode connected to the connected conductor 88C by the via conductor 99, and connected to an electrode of the external substrate that is not depicted. Specifically, the mounting electrode 89C is connected to the mounting electrode 57A of the chip capacitive element 54A. The mounting electrode 89D is an electrode connected to the connected conductor 88D by the via conductor 99, and connected to an electrode of the external substrate that is not depicted. Specifically, the mounting electrode 89D is connected to the mounting electrode 57A of the chip capacitive element 54B via the connected conductor 88D. The mounting electrode 89E is an electrode connected to the connected conductors 88E and 88F by the via conductor 99, and connected to an electrode of the external substrate that is not depicted. Specifically, the mounting electrode 89E is connected to the mounting electrode 57B of the chip capacitive element 54A and the mounting electrode 57B of the chip capacitive element 54B via the connected conductor 88E, 88F.

Figure 7:
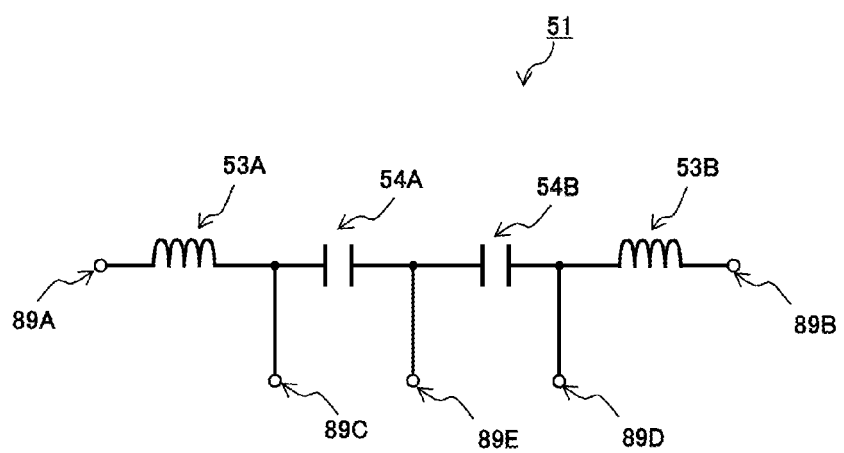
FIG. 7 is an equivalent circuit schematic of the LC composite component according to the second embodiment of the present disclosure.

FIG. 7 is an equivalent circuit schematic of the LC composite component 51.

The pattern coil 53A, the chip capacitive element 54A, the chip capacitive element 54B, and the pattern coil 53B are connected in series. The pattern coil 53A is also connected between the mounting electrode 89A and the mounting electrode 89C. The chip capacitive element 54A is connected between the mounting electrode 89C and the mounting electrode 89E. The chip capacitive element 54B is connected between the mounting electrode 89D and the mounting electrode 89E. The pattern coil 53B is connected between the mounting electrode 89D and the mounting electrode 89B. The LC composite component 51 constitutes a filter circuit, and functions as a dual system of low-pass filters (LPFs) by using the mounting electrode 89E as a ground connecting electrode and the mounting electrodes 89A, 89B, 89C, and 89D as signal input/output terminals, for example.

As described above, the LC composite component 51 according to this embodiment is configured such that the chip capacitive element 54A is disposed within the pattern coil 53A and the chip capacitive element 54B is disposed within the pattern coil 53B. Therefore, it is possible to reduce a space for providing the chip capacitive elements 54A and 54B. With this, the LC composite component 51 as a whole may be made smaller as compared to a case in which the chip capacitive elements 54A and 54B are respectively disposed outside the pattern coils 53A and 53B.

Further, in this embodiment, each of the chip capacitive elements 54A and 54B is configured by the ceramic body 55 having a higher relative permittivity than that of the multi-layer substrate 52, and therefore it is possible to make the chip capacitive elements 54A and 54B smaller as compared to a case in which a dielectric layer having a relative permittivity that is substantially the same as that of the multi-layer substrate 52 is used. Accordingly, an amount of the magnetic flux blocked by the chip capacitive elements 54A and 54B disposed within the pattern coils 53A and 53B decreases.

Moreover, the chip capacitive elements 54A and 54B are arranged such that the stacking direction of the ceramic body 55 is perpendicular to the stacking direction of the multi-layer substrate 52, and the counter electrodes 56 are respectively disposed in parallel with the stacking direction of the multi-layer substrate 52. As a direction of magnetic flux within the pattern coils 53A and 53B substantially matches the stacking direction of the multi-layer substrate 52, the magnetic flux of the pattern coils 53A and 53B passes through the ceramic bodies 55 of the chip capacitive elements 54A and 54B.

Furthermore, within the pattern coils 53A and 53B, the via conductors 91, 92, 93, 98, and 99 are provided so as to overlap the mounting electrodes 57A and 57B of the chip capacitive elements 54A and 54B, when viewed along the stacking direction of the multi-layer substrate 52. Therefore, as compared to a case in which the via conductors 91, 92, 93, 98, and 99 are displaced from the mounting electrodes 57A and 57B of the chip capacitive elements 54A and 54B, an amount of the magnetic flux blocked by the via conductor 91, 92, 93, 98, 99 decreases.

Moreover, in the LC composite component 51 thus configured, its bottom surface constitutes a mounting surface to an external substrate. In general, a region of the external substrate that faces the LC composite component 51 is provided with a ground electrode and a mounting electrode. Therefore, in a state in which the LC composite component 51 is mounted on the external substrate, magnetic fields generated by the pattern coils 53A and 53B of the LC composite component 51 become weaker on a side of the bottom surface than on a side of the top surface.

As illustrated in FIG. 5, in the LC composite component 51, along the stacking direction of the multi-layer substrate 52, a center of the chip capacitive elements 54A and 54B is displaced to the side of the bottom surface from a center of the pattern coils 53A and 53B. Therefore, the chip capacitive elements 54A and 54B are placed in regions where the magnetic fields of the pattern coils 53A and 53B are weak. With this, a loop of the magnetic field may not be prevented in a region on the side of the top surface where the magnetic field is strong.

As a result, it is possible to prevent inductances of the pattern coils 53A and 53B from decreasing. Therefore, it is easily possible to achieve desired inductances of the pattern coils 53A and 53B, even if the chip capacitive elements 54A and 54B are disposed within the pattern coils 53A and 53B to make the LC composite component 51 small.

Next, an LC composite component according to a third embodiment of the present disclosure will be described.

Figure 8A:
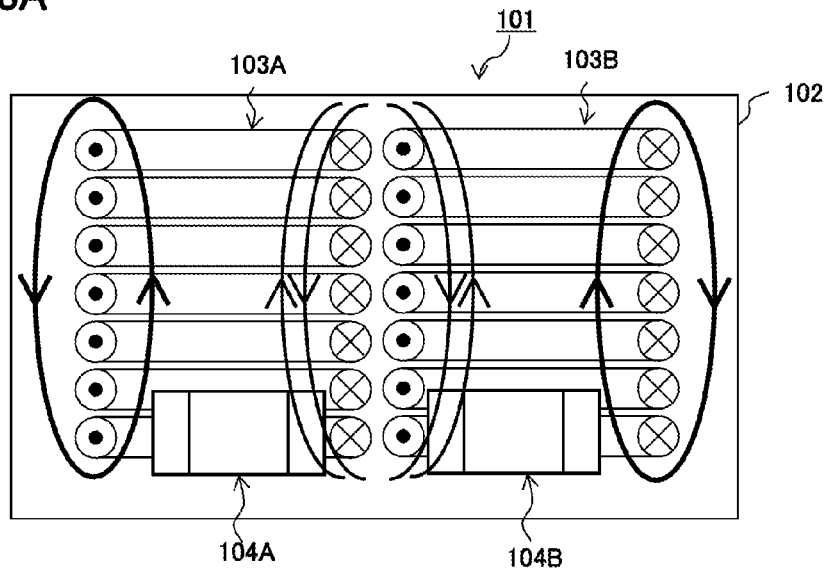
FIG. 8A is a schematic view illustrating an LC composite component according to a third embodiment of the present disclosure.
Figure 8:
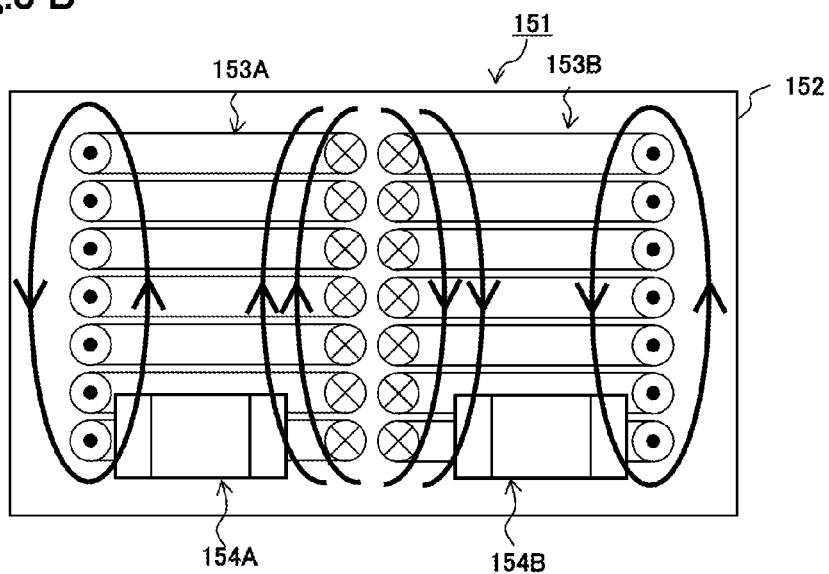
FIG. 8B is a schematic view illustrating an LC composite component according to a modified example of the third embodiment of the present disclosure.

FIG. 8A is a schematic view illustrating an LC composite component 101 according to the third embodiment of the present disclosure. In FIG. 8A, the pattern coil is schematically illustrated as a wire coil.

The LC composite component 101 includes a multi-layer substrate 102, pattern coils 103A and 103B, and chip capacitive elements 104A and 104B. The chip capacitive elements 104A and 104B here are chip capacitors.

The pattern coil 103A and the pattern coil 103B are in a coiled shape of which the coil axis extends along the stacking direction of the multi-layer substrate 102, and are adjacent to each other in a direction perpendicular to the stacking direction of the multi-layer substrate 102. Further, magnetic flux within the pattern coil 103A and the pattern coil 103B is directed from a bottom surface toward a top surface of the multi-layer substrate 102.

In such a configuration, as the magnetic flux within the pattern coil 103A and that within the pattern coil 103B adjacent to the pattern coil 103A are directed in the same direction, distribution of magnetic fields are unevenly distributed within the pattern coils 103A and 103B, and the magnetic field becomes weaker as a distance to the adjacent pattern coil becomes closer.

Therefore, in the LC composite component 101, in a direction in which the pattern coil 103A and the pattern coil 103B are arranged adjacently, a center of the chip capacitive element 104A is displaced to a side of the adjacent pattern coil 103B from a center of the pattern coil 103A. Further, a center of the chip capacitive element 104B is displaced to a side of the adjacent pattern coil 103A from a center of the pattern coil 103B.

Therefore, an amount of the magnetic flux blocked by the chip capacitive elements 104A and 104B decreases as compared to a case in which the chip capacitive elements 104A and 104B are placed apart from each other, and it is possible to prevent reduction of inductances of the pattern coils 103A and 103B.

FIG. 8B is a schematic view illustrating an LC composite component 151 according to a modified example of the third embodiment. In FIG. 8B, the pattern coil is schematically illustrated as a wire coil.

The LC composite component 151 includes multi-layer substrate 152, pattern coils 153A and 153B, and chip capacitive elements 154A and 154B. The chip capacitive elements 154A and 154B here are chip capacitors.

The pattern coil 153A and the pattern coil 153B are in a coiled shape of which the coil axis extends along the stacking direction of the multi-layer substrate 152, and are adjacent to each other in a direction perpendicular to the stacking direction of the multi-layer substrate 152. Further, magnetic flux within the pattern coil 153A and magnetic flux within the pattern coil 153B are directed to directions opposite from each other. Specifically, the magnetic flux within the pattern coil 153A is directed from a bottom surface toward a top surface of the multi-layer substrate 152, and the magnetic flux within the pattern coil 153B is directed from the top surface toward the bottom surface of the multi-layer substrate 152.

In such a configuration, as the magnetic flux within the pattern coil 153A and that within the pattern coil 153B adjacent to the pattern coil 103A are directed in the opposite directions, distribution of magnetic fields are unevenly distributed within the pattern coils 153A and 153B, and the magnetic field becomes stronger as a distance to the adjacent pattern coils 153A and 153B becomes closer.

Therefore, in the LC composite component 151, in a direction in which the pattern coil 153A and the pattern coil 153B are arranged adjacently, a center of the chip capacitive element 154A is displaced to an opposite side of the adjacent pattern coil 153B from a center of the pattern coil 153A. Further, a center of the chip capacitive element 154B is displaced to an opposite side of the adjacent pattern coil 153A from a center of the pattern coil 153B.

Therefore, an amount of the magnetic flux blocked by the chip capacitive elements 154A and 154B decreases as compared to a case in which the chip capacitive elements 154A and 154B are placed close to each other, and it is possible to prevent reduction of inductances of the pattern coils 153A and 153B.

Next, an LC composite component according to a fourth embodiment will be described. The LC composite component described here has, in addition to the filtering function, a function of ESD protection for letting large electric power such as static electricity to ground through an external connecting terminal.

Figure 9A:
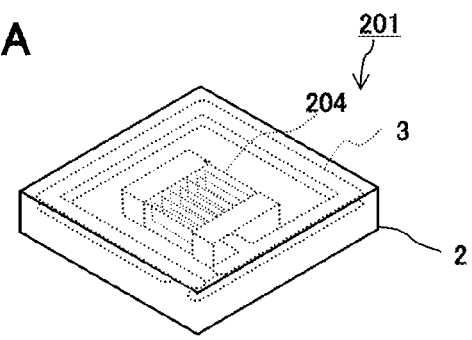
FIG. 9A is a perspective view illustrating an LC composite component according to a fourth embodiment of the present disclosure.

FIG. 9A is a perspective view illustrating an LC composite component 201 according to the fourth embodiment.

The LC composite component 201 includes a multi-layer substrate 2, a pattern coil 3, and a chip capacitive element 204. The multi-layer substrate 2 and the pattern coil 3 have the same configurations as those in the first embodiment. The chip capacitive element 204 here is a chip varistor, and has the same configuration as the chip capacitive element 4 illustrated in in FIG. 1B, but the ceramic body 5 is configured by semiconductor ceramics. The semiconductor ceramics have a high relative permittivity. The chip capacitive element 204 as a chip varistor has a characteristic that a resistance rapidly decreases when a voltage over a varistor voltage is applied, and has a high capacitance similar to a chip capacitor in a state in which a voltage under the varistor voltage is applied. The chip capacitive element 4 is disposed within the pattern coil 3.

Figure 9B:
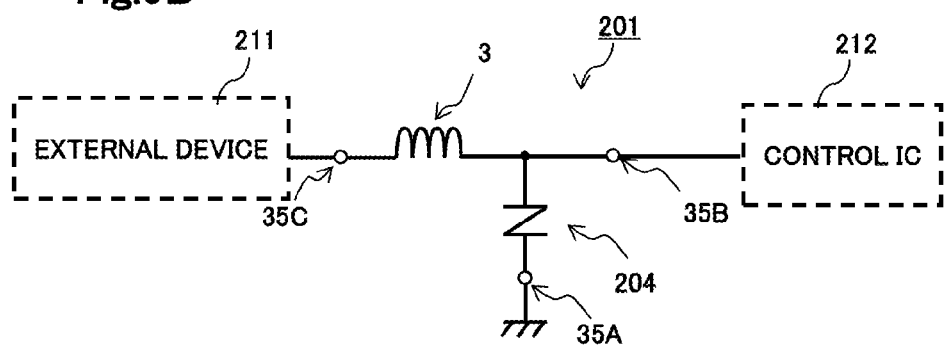
FIG. 9B is an equivalent circuit schematic of the LC composite component according to the fourth embodiment of the present disclosure.

FIG. 9B is an equivalent circuit schematic of the LC composite component 201.

The LC composite component 201 includes mounting electrodes 35A, 35B, and 35C in the same configuration as those in the first embodiment. The pattern coil 3 included in the LC composite component 201 is connected in series between the mounting electrode 35B and the mounting electrode 35C. Further, the chip capacitive element 204 is connected in series between the mounting electrode 35B and the mounting electrode 35A. The mounting electrode 35A is used as a ground connecting electrode. The mounting electrode 35B is connected to a control IC 212 and used as a signal input/output terminal. The mounting electrode 35C is connected to an the external device 211 such as an earphone jack, a loudspeaker, a microphone, or a USB device via a connector that is not depicted, and used as a signal input/output terminal.

The LC composite component 201 functions as a low-pass filter (LPF) when a voltage lower than the varistor voltage is applied to the chip capacitive element 204 as a chip varistor. Further, when a voltage equal to or higher than the varistor voltage is applied to the chip capacitive element 204, a resistance between the mounting electrode 35B and the mounting electrode 35A becomes low to let current flow to the ground. Thus the LC composite component 201 functions as an electrostatic discharge protection circuit. Therefore, by providing the LC composite component 201 for a connecting line between the external device 211 and the control IC 212, it is possible to remove noises in signals transmitted between the external device 211 and the control IC 212, and to provide electrostatic discharge protection between the external device 211 and the control IC 212.

In the LC composite component 201 according to this embodiment, the chip capacitive element 204 is also provided within the pattern coil 3. Therefore, it is possible to reduce a space for providing the chip capacitive element 204 in the LC composite component 201. With this, the LC composite component 201 as a whole may be made smaller as compared to a case in which the chip capacitive element 204 is disposed outside the pattern coil 3.

Further, it is possible to downsize the chip capacitive element 204 by configuring the chip capacitive element 204 having a higher relative permittivity than that of the multi-layer substrate 2. Therefore, an amount of the magnetic flux blocked by the chip capacitive element 204 within the pattern coil 3 is small, and it is possible to downsize the LC composite component 201 while achieving both a high inductance and a high capacitance.

Moreover, the chip capacitive element 204 is disposed such that the counter electrodes are in parallel with the stacking direction of the multi-layer substrate 2 so that the magnetic flux of the pattern coil 3 passes through the chip capacitive element 204 without hitting against the counter electrodes. With this, it is also possible for the LC composite component 201 to achieve a high inductance.

As a result, it is possible to prevent an inductance of the pattern coil 3 from decreasing. Therefore, it is easily possible to achieve a desired inductance of the pattern coil 3, even if the chip capacitive element 204 is disposed within the pattern coil 3 to make the LC composite component 201 small.

Next, an LC composite component according to a fifth embodiment will be described. The LC composite component described here is provided monolithically with a substrate on which a control IC is mounted.

Figure 10A:
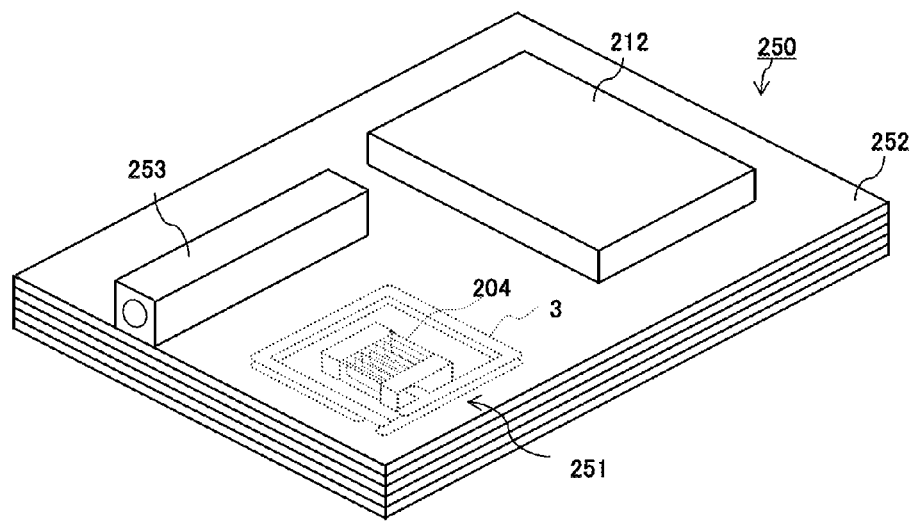
FIG. 10A is a perspective view illustrating a composite substrate having an LC composite component according to a fifth embodiment of the present disclosure.

FIG. 10A is a perspective view illustrating an LC composite component 250 according to the fifth embodiment.

The LC composite component 250 includes a multi-layer substrate 252, a control IC 212, and an earphone jack 253 as an external device. The control IC 212 is a surface-mount component, and surface-mounted on one principal surface of the multi-layer substrate 252. The earphone jack 253 is a surface-mount component to which an earphone is connected, and surface-mounted on one principal surface of the multi-layer substrate 252. The earphone jack 253 is provided with an insertion hole through which a terminal of an earphone is inserted.

The multi-layer substrate 252 is configured by a total of five insulating layers stacked one above the other, and includes the control IC 212 and the earphone jack 253 surface-mounted thereon as well as an LC unit 251 built therein. The LC unit 251 includes a pattern coil 3 and a chip capacitive element 204 as a chip varistor. The LC unit 251 may be configured by a chip capacitor, in place of the chip varistor. The control IC 212, the earphone jack 253, and the LC unit 251 are connected to each other via internal wiring (not depicted) provided within the multi-layer substrate 252.

Figure 10B:
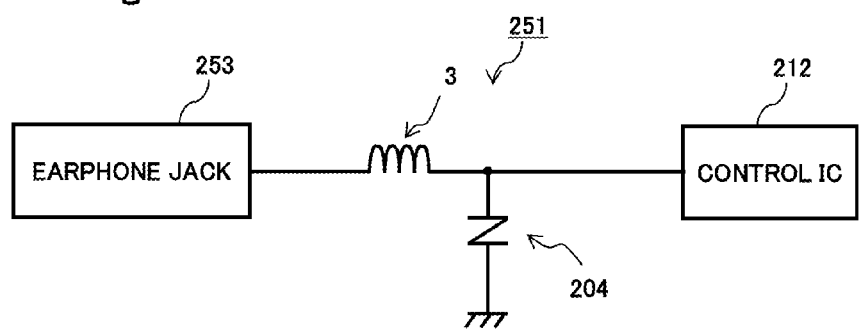
FIG. 10B is an equivalent circuit schematic of the composite substrate having the LC composite component according to the fifth embodiment of the present disclosure.

FIG. 10B is a circuit diagram of the LC composite component 250. The pattern coil 3 is connected in series between the earphone jack 253 and the control IC 212. The chip capacitive element 204 is connected in series between the control IC 212 and the ground.

In the LC composite component 250, the chip capacitive element 204 and the pattern coil 3 function as a low-pass filter (LPF) when a voltage lower than a varistor voltage is applied to the chip capacitive element 204 being a chip varistor. Further, when a voltage equal to or higher than the varistor voltage is applied to the chip capacitive element 204, a resistance of the chip capacitive element 204 becomes low to let current flow to the ground. Therefore, it is possible for the LC composite component 250 to remove noises in transmitted signals in a connecting line between the earphone jack 253 being an external device and the control IC 212, and to provide electrostatic discharge protection.

Moreover, in the LC composite component 250, the chip capacitive element 204 is also provided within the pattern coil 3. With this, the LC composite component 250 as a whole may be made smaller as compared to a case in which the chip capacitive element 204 is disposed outside the pattern coil 3.

Furthermore, the chip capacitive element 204 has a higher relative permittivity than that of the multi-layer substrate 252. Therefore, an amount of the magnetic flux blocked by the chip capacitive element 204 within the pattern coil 3 is small, and it is possible to downsize the LC composite component 250 while achieving both a high inductance and a high capacitance.

Further, the chip capacitive element 204 is disposed such that the counter electrodes are in parallel with the stacking direction of the multi-layer substrate 252 so that the magnetic flux of the pattern coil 3 passes through the chip capacitive element 204 while scarcely hitting against the counter electrodes. With this, it is also possible for the LC composite component 250 to achieve a high inductance.

As a result, it is possible to prevent an inductance of the pattern coil 3 from decreasing. Therefore, it is easily possible to achieve a desired inductance of the pattern coil 3, even if the chip capacitive element 204 is disposed within the pattern coil 3 to make the LC composite component 250 small.

Next, an LC composite component according to a sixth embodiment will be described. In the following, like components as in the LC composite component according to the first embodiment are denoted by like reference numerals.

Figure 11A:
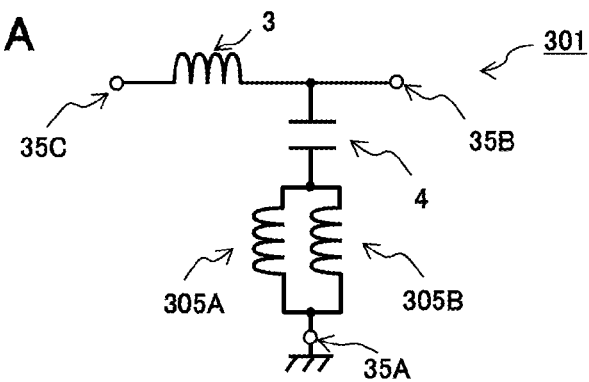
FIG. 11A is an equivalent circuit schematic of the LC composite component according to the sixth embodiment of the present disclosure.

FIG. 11A is an equivalent circuit schematic of an LC composite component 301 according to the sixth embodiment. The LC composite component 301 includes, in addition to the pattern coil 3 and the chip capacitive element 4, a first inductor 305A and a second inductor 305B. The first inductor 305A and the second inductor 305B are connected in parallel with each other, and connected between the chip capacitive element 4 and the mounting electrode 35A. In the LC composite component 301, by using the mounting electrode 35A as a ground connecting electrode, the mounting electrode 35C as a first signal input/output terminal, and the mounting electrode 35B as a second signal input/output terminal, an attenuation pole based on series resonance between the first inductor 305A and the second inductor 305B and the chip capacitive element 4 is set in filter characteristics of a filter circuit configured by the pattern coil 3 and the chip capacitive element 4.

Figure 11B:
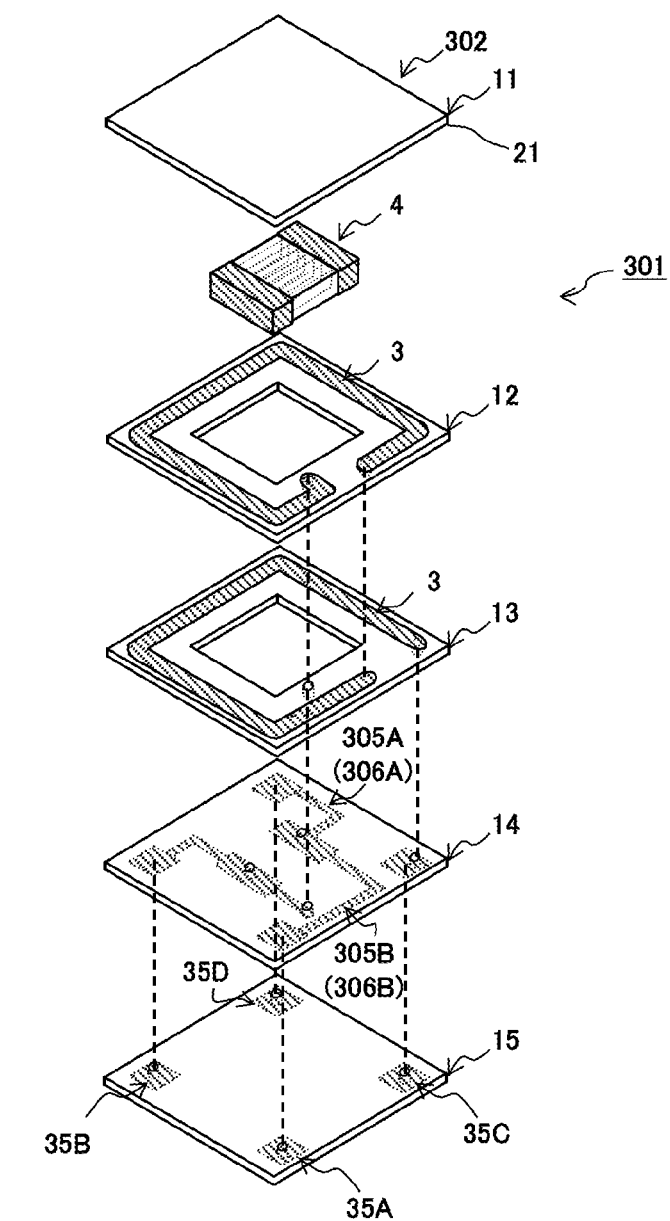
FIG. 11B is an exploded perspective view of the LC composite component according to the sixth embodiment of the present disclosure.

FIG. 11B is an exploded perspective view of the LC composite component 301.

The LC composite component 301 includes a multi-layer substrate 302. The multi-layer substrate 302 is configured such that the resin sheets 11, 12, 13, 14, and 15 are stacked from a top surface to a bottom surface. The pattern coil 3 is disposed over the resin sheets 12 and 13. The first inductor 305A and the second inductor 305B are respectively configured by the connected conductors 306A and 306B provided for the resin sheet 14.

FIG. 12 is an exploded plan view of the multi-layer substrate 302 in which its layers are viewed in a planar view from their top surfaces.

The resin sheet 11 includes an insulating layer 21 in a flat plate shape. The resin sheet 12 includes an insulating layer 22 having the opening 22A, a coil conductor 332, and via conductors 342A and 342B. The resin sheet 13 includes an insulating layer 23 having the opening 23A, a coil conductor 333, and via conductors 343A and 343B. The resin sheet 14 includes an insulating layer 24 in a flat plate shape, connected conductors 306A, 306B, 306C, and 306D, pad conductors 307A, 307B, 307C, 307D, 307E, and 307F, and via conductors 344A, 344B, 344C, and 344D. The resin sheet 15 includes an insulating layer 25 in a flat plate shape, mounting electrodes 35A, 35B, 35C, and 35D, and a via conductor 345.

The coil conductor 332 and the coil conductor 333 are connected by the via conductor 342A to constitute the pattern coil 3. One end of the pattern coil 3 is connected to the connected conductor 306D of the resin sheet 14 by the via conductor 342B, the via conductor 343B, and the via conductor 344B. The other end of the pattern coil 3 is connected to the pad conductor 307C of the resin sheet 14 by the via conductor 343A and the via conductor 344A. The pad conductor 307C is connected to the mounting electrode 35C by the via conductor 345 of the resin sheet 15.

The chip capacitive element 4 is disposed within the openings 22A and 23A of the resin sheets 12 and 13, and connected to the pad conductors 307E and 307F by the via conductors 344C and 344D of the resin sheet 14. The pad conductor 307E is connected to the pad conductors 307D and 307A via the connected conductors 306A and 306B. The pad conductors 307D and 307A are respectively connected to the mounting electrodes 35D and 35A by the via conductor 345 of the resin sheet 15.

The pad conductor 307F is connected to the pad conductor 307B via the connected conductor 306C. The pad conductor 307B is connected to the mounting electrode 35B by the via conductor 345 of the resin sheet 15. Further, the pad conductor 307F is connected to the via conductor 344B via the connected conductor 306D, and to the pattern coil 3 by the via conductors 342B, 343B, and 344B.

In the LC composite component 301 according to this embodiment, it is possible to downsize the LC composite component 301 while achieving both a high inductance of the pattern coil 3 and a high capacitance of the chip capacitive element 4 by configuring the chip capacitive element 4 so as to have a relative permittivity higher than that of the multi-layer substrate 302, and such that the magnetic flux of the pattern coil 3 passes while scarcely hitting against the counter electrodes of the chip capacitive element 4.

Further, according to the LC composite component 301 of this embodiment, it is possible to adjust an attenuation pole by providing the attenuation pole for the filter characteristics using the first inductor 305A and the second inductor 305B respectively configured by the connected conductors 306A and 306B of the resin sheet 14, and by adjusting a coupling state between the first inductor 305A and the second inductor 305B and the pattern coil 3.

Specifically, the connected conductor 306A is wired such that the connected conductor 306A of the resin sheet 14 faces a part of the coil conductor 333 of the resin sheet 13, and such that a current flows therethrough in the same direction as that in the coil conductor 333. With this, magnetic field coupling of the first inductor 305A in phase with the pattern coil 3 (by a positive coupling factor) is achieved. Further, the connected conductor 306B is wired such that the connected conductor 306B of the resin sheet 14 faces a part of the coil conductor 333 of the resin sheet 13, and such that a current flows therethrough in a direction opposite from that in the coil conductor 333. With this, magnetic field coupling of the second inductor 305B in reversed phase with the pattern coil 3 (by a negative coupling factor) is achieved.

In this manner, by achieving magnetic field coupling between the first and the second inductance configured by the connected conductors 306A and 306B and the pattern coil 3, respectively, it is possible to accurately adjust filter characteristics or the like of the LC composite component 301 by controlling the coupling state.

Here, in the LC composite component 301 according to this embodiment, various examples of wiring of the connected conductor and relation between the filter characteristics will be described.

Figure 13A:
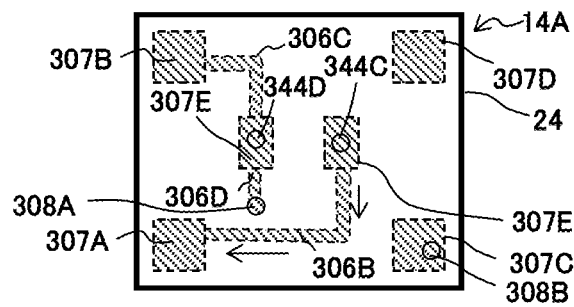
FIG. 13A is an exploded plan view illustrating a different example of wiring of a connected conductor.
Figure 13B:
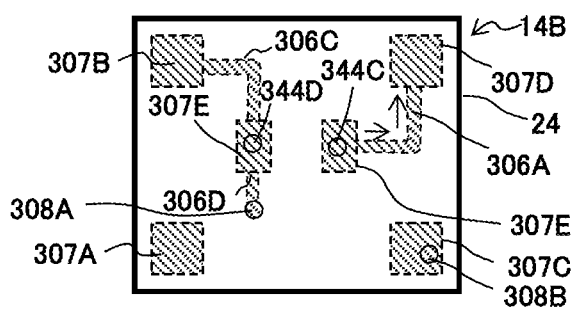
FIG. 13B is an exploded plan view illustrating a different example of wiring of the connected conductor.
Figure 13C:
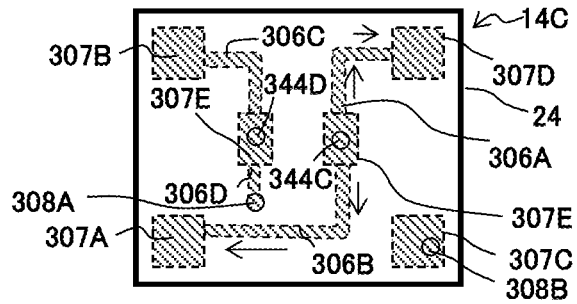
FIG. 13C is an exploded plan view illustrating a different example of wiring of the connected conductor.

FIG. 13A is a plan view illustrating the resin sheet 14A according to a modified example of the LC composite component of this embodiment. FIG. 13B is a plan view illustrating the resin sheet 14B according to a modified example of the LC composite component of this embodiment. FIG. 13C is a plan view illustrating the resin sheet 14C according to a modified example of the LC composite component of this embodiment.

In the resin sheet 14A illustrated in FIG. 13A, out of the connected conductors 306A and 306B, the connected conductor 306A is omitted, and only the second inductor 305B that achieves magnetic field coupling in reversed phase with the pattern coil 3 is provided.

In the resin sheet 14B illustrated in FIG. 13B, out of the connected conductors 306A and 306B, the connected conductor 306B is omitted, and only the first inductor 305A that achieves magnetic field coupling in phase with the pattern coil 3 is provided.

In the resin sheet 14C illustrated in FIG. 13C, both of the connected conductors 306A and 306B are provided without being omitted, but the connected conductor 306A is wired such that a current flows in the direction opposite from that in the coil conductor 333. With this, magnetic field coupling between the first inductor 305A and the pattern coil 3 in reversed phase (buy a negative coupling factor) is achieved.

Figure 14:
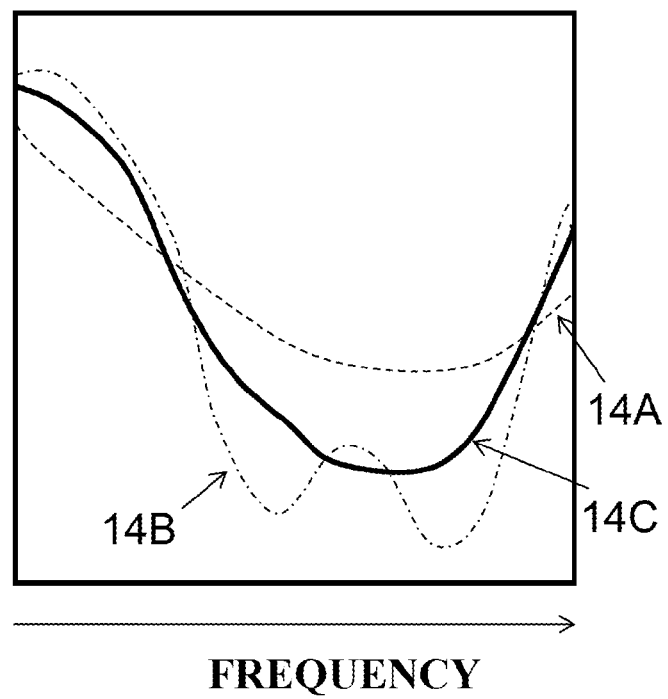
FIG. 14 is a diagram exemplary illustrating filter characteristics of the LC composite component.

FIG. 14 is a diagram exemplary illustrating filter characteristics of the modified examples respectively using the resin sheet 14A to the resin sheet 14C. The chart shows an insertion loss in a frequency near the attenuation pole due to the inductor and the chip capacitive element. As illustrated in FIG. 14, by appropriately adjusting (modifying) the coupling state between the first inductor 305A and the second inductor 305B with the pattern coil 3, it is possible to adjust filter characteristics of the LC composite component, to increase in particular the attenuation pole. Therefore, by appropriately setting the wiring of the first inductor 305A or the second inductor 305B, it is easily possible to achieve desired filter characteristics.

While the example in which a chip capacitor is used as the chip capacitive element in this embodiment, the chip capacitive element may be a chip varistor or the like. Further, the LC composite component may be configured as a composite substrate on which the multi-layer substrate along with other circuit elements is mounted. In addition, in the second embodiment to the sixth embodiment, the first inductor or the second inductor that achieves magnetic field coupling with the pattern coil may be provided, similarly to this embodiment.

REFERENCE SIGNS LIST 1, 51, 101, 151, 201, 250, 301 LC composite component
2, 52, 102, 152, 252, 302 multi-layer substrate
3, 53A, 53B, 103A, 103B, 153A, 153B pattern coil
4, 54A, 54B, 104A, 104B, 154A, 154B, 204 chip capacitive element
5, 55 ceramic body
6, 56 capacitor electrode
7A, 7B, 57A, 57B mounting electrode
11, 12, 13, 14, 15 resin sheet
21, 22, 23, 24, 25, 71, 72, 73, 74, 75, 76, 77, 78, 79 insulating layer
22A, 23A, 74A, 75A, 76A, 77A, 74B, 75B, 76B, 77B opening
32, 33, 34, 35, 81, 82, 83, 84, 85, 86, 87, 88, 89 wiring layer
32A, 33A, 81A, 82A, 83A, 84A, 85A, 86A, 87A, 88A, 81B, 82B, 83B, 84B, 85B, 86B, 87B,
88B coil conductor
32B, 34A, 34B, 34C, 81C, 82C, 83C, 81D, 82D, 83D, 88C, 88D, 88E, 88F, 89A, 89B, 89C, 89D,
89E, 306A, 306B, 306C, 306D connected conductor
35A, 35B, 35C, 35D mounting electrode
42, 43, 44, 45, 91, 92, 93, 94, 95, 96, 97, 98, 99 via conductor
211 external device
212 control IC
251 LC unit
253 earphone jack

What is claimed is:
1. An LC composite component comprising:
a multi-layer substrate configured such that a plurality of insulating layers are stacked;

a first pattern coil forming a coiled shape of which a first coil axis extends along a stacking direction of the multi-layer substrate, and including a coil conductor disposed between the plurality of insulating layers; and
a chip capacitive element including a dielectric body having a relative permittivity higher than that of the plurality of insulating layers and counter electrodes that face against each other with the dielectric body interposed between the counter electrodes,
wherein all of the chip capacitive element is disposed within the coil conductor of the first pattern coil.

2. The LC composite component according to claim 1, wherein
the chip capacitive element is disposed such that each of the counter electrodes is in parallel with the stacking direction of the multi-layer substrate.

3. The LC composite component according to claim 1, wherein
the chip capacitive element includes one principal surface facing the stacking direction of the multi-layer substrate,
the one principal surface is a mounting surface facing an external substrate, and
a center of the chip capacitive element in the stacking direction of the multi-layer substrate is displaced toward a side of the mounting surface from a center of the first pattern coil in the stacking direction of the multi-layer substrate.

4. The LC composite component according to claim 1, wherein
the chip capacitive element includes a mounting electrode facing the stacking direction of the multi-layer substrate,
the multi-layer substrate includes via conductors on a top and a bottom of the multi-layer substrate in the stacking direction of the multi-layer substrate with respect to the chip capacitive element, the via conductors extending from the mounting electrode along the stacking direction of the multi-layer substrate as a part of wiring connected to the chip capacitive element, and
the mounting electrode is connected between the via conductors.

5. The LC composite component according to claim 1, further comprising:
a second pattern coil, being adjacent to the first pattern coil on a side perpendicular to the stacking direction of the multi-layer substrate, and forming a coiled shape of which a second coil axis extends along the stacking direction of the multi-layer substrate, wherein
a direction of magnetic flux within the first pattern coil is the same as a direction of magnetic flux within the second pattern coil, and
a center of the chip capacitive element, in a direction along which the first pattern coil and the second pattern coil are adjacent, is displaced toward a side of the second pattern coil from a center of the first pattern coil.

6. The LC composite component according to claim 1, further comprising:
a second pattern coil being adjacent to the first pattern coil on a side perpendicular to the stacking direction of the multi-layer substrate, and forming a coiled shape of which a second coil axis extends along the stacking direction of the multi-layer substrate, wherein
a direction of magnetic flux within the first pattern coil is opposite from a direction of magnetic flux within the second pattern coil, and a center of the chip capacitive element, in a direction along which the first pattern coil and the second pattern coil are adjacent, is displaced toward a side opposite from the second pattern coil from a center of the first pattern coil.

7. The LC composite component according to claim 1, wherein
a filter circuit is configured by connecting the first pattern coil and the chip capacitive element.

8. The LC composite component according to claim 1, wherein
the chip capacitive element is a chip capacitor.

9. The LC composite component according to claim 1, wherein
the chip capacitive element is a chip varistor.

10. The LC composite component according to claim 1, further comprising:
a first inductor configured by a first conductor extending and facing the first pattern coil between the plurality of insulating layers, and connected to the first pattern coil via the chip capacitive element.

11. The LC composite component according to claim 10, further comprising:
a first signal input/output terminal;
a second signal input/output terminal; and
a ground connecting electrode, wherein
the first pattern coil is connected between the first signal input/output terminal and the second signal input/output terminal,
the chip capacitive element has a first end connected to a connecting point between the first pattern coil and the second signal input/output terminal, and
the first inductor is connected between a second end of the chip capacitive element and the ground connecting electrode.

12. The LC composite component according to claim 10, wherein
in a region in which the first inductor faces the first pattern coil, a direction of a current flowing through the first inductor is the same as a direction of a current flowing through the first pattern coil.

13. The LC composite component according to claim 10, wherein
in a region in which the first inductor faces the first pattern coil, a direction of a current flowing through the first inductor is opposite from a direction of a current flowing through the first pattern coil.

14. The LC composite component according to claim 10, further comprising:
a second inductor configured by a second conductor extending and facing the first pattern coil between the plurality of insulating layers, and connected to the first inductor in parallel.

15. The LC composite component according to claim 14, wherein
in a region in which the second inductor faces the first pattern coil, a direction of a current flowing through the second inductor is the same as a direction of a current flowing through the first pattern coil.

16. The LC composite component according to claim 14, wherein
in a region in which the second inductor faces the first pattern coil, a direction of a current flowing through the second inductor is opposite from a direction of a current flowing through the first pattern coil.

17. The LC composite component according to claim 1, wherein
the chip capacitive element is disposed such that each of the counter electrodes is in parallel with a planar surface of the multi-layer substrate.

\* \* \* \* \*